United States Patent [19]

Kruse et al.

[11] Patent Number: 5,594,378

[45] Date of Patent: Jan. 14, 1997

[54] FAST HIGH VOLTAGE MODULATOR CIRCUIT

[76] Inventors: Neils A. Kruse, 7415 Cove Dr., Cary, Ill. 60013; Donald A. Brichta, 3909 Rose St., Western Springs, Ill. 60058

[21] Appl. No.: 423,330

[22] Filed: Apr. 13, 1995

[51] Int. Cl.$^6$ .......................... H03K 17/687; H03K 17/04
[52] U.S. Cl. ...................... 327/304; 327/377; 327/177; 307/419; 307/106
[58] Field of Search ...................... 327/181, 177, 327/110, 112, 434, 436, 328, 304, 376, 374, 172, 377, 382; 307/419, 421, 106; 372/38; 330/269, 264, 262, 276

[56] References Cited

U.S. PATENT DOCUMENTS

| | | | |
|---|---|---|---|
| 2,885,549 | 5/1959 | Speller | 327/304 |
| 3,639,784 | 2/1972 | Kelleher, Jr. | 327/294 |
| 3,659,190 | 4/1972 | Galluppi | 23/22 T |
| 3,686,516 | 8/1972 | Guadagnolo | 307/263 |
| 4,281,272 | 7/1981 | Spilsbury | 315/1 |
| 4,349,750 | 9/1982 | Geurts | 307/243 |
| 4,359,650 | 11/1982 | Newcomb | 307/270 |
| 4,370,607 | 1/1983 | Dassonville | 323/271 |
| 4,454,430 | 6/1984 | Miller | 327/304 |
| 4,532,433 | 7/1985 | Basile | 307/241 |
| 4,743,785 | 5/1988 | Milberger et al. | 327/376 |
| 4,910,416 | 3/1990 | Salcone | 327/374 |
| 5,162,965 | 11/1992 | Milberger et al. | 361/56 |
| 5,276,357 | 1/1994 | Cripe | 327/231 |

OTHER PUBLICATIONS

Data Sheet PD-9.604, Hexfet Transistors, International Rectifier (8 pages) Mar. 1988.

*Primary Examiner*—Timothy P. Callahan
*Assistant Examiner*—Terry L. Englund

[57] ABSTRACT

A fast, high voltage modulator circuit (10) has a drive circuit (12) apply input pulses to an on-section (88) and an off-section (90). The on-section (88) and off-section (90) having a common output (46). A pair of transformers (18,24) connects the drive circuit (12) to the on-section (88) and off-section (90) respectively. The drive circuit (12) applies a pulse to the first transformer (18), which transmits the pulse to a first MOSFET (32) closing the first MOSFET (32) to connect an input high voltage (40) to the output (46). The drive circuit (12) applies an off pulse to the second transformer (24), which transmits the pulse to second and third MOSFETS (62,82), closing the second MOSFET (62) and connecting a lower input voltage (68) to the output (46). Also, closing the third MOSFET (82) that shorts out a gate (34) of the first MOSFET (32), thus opening the first MOSFET (32). The entire circuit is modular, being stackable to switch higher voltages.

13 Claims, 2 Drawing Sheets

5,594,378

FAST HIGH VOLTAGE MODULATOR CIRCUIT

THE FIELD OF THE INVENTION

The invention relates generally to the field of modulator circuits and more particularly to high voltage modulator circuits having high speed switching and fast repetition rate capabilities useful for high speed switching of microwave tubes and electro-optic devices such as Pockels cells.

BACKGROUND OF THE INVENTION

Prior art modulator circuit designs have proposed using bipolar transistor circuits (U.S. Pat. No. 4,359,650) and avalanche transistor circuits (U.S. Pat No. 3,686,516). Such designs have been limited in rise time and fall time of operation resulting in a limited repetition rate. Previous switch designs used switch housekeeping power supplies floating on or near the AC output voltage. The bias supplies require a transformer with a secondary winding, rectifier and filter capacitor for each switch section. The secondaries and circuitry add stray capacitance which is a detriment to high speed switching. The rise times and repetition rates of operation from known modulator circuits has not been fast enough for all applications particularly those where very fast response modulators are used to drive Q-switches and Pockels cells. There is, therefore, a need for an improved modulator circuit which will overcome these limitations.

SUMMARY OF THE INVENTION

It is an object of the invention to provide a fast, high voltage basic modulator circuit, the basic circuit being stackable to achieve switching of higher voltages and which has fast turn-on and turn-off times (rise and fall times) of less that about 10 nanoseconds.

It is a further object of the invention to provide a modulator circuit of the above character capable of operation at fast repetition rates as fast as 5 MHZ.

It is another object of the invention to provide a circuit of the above character including a drive section driving an on-section and an off-section, the on-section and off-section having a common output. The on-section switches a first high voltage to the output when receiving an on signal from the drive section, while the off-section switches a second lower,more negative voltage to the output when an off signal is received from the drive section and concurrently switches off the on-section when receiving an off signal.

It is a further object of the invention to eliminate the use of floating bias power supplies for the high voltage switch.

These and other features and objects of the invention will become apparent with reference to the accompanying description and claims when taken with the accompanying drawings, of which:

DETAILED DESCRIPTION OF THE PREFERRED EMBODIMENT

Figure 1:
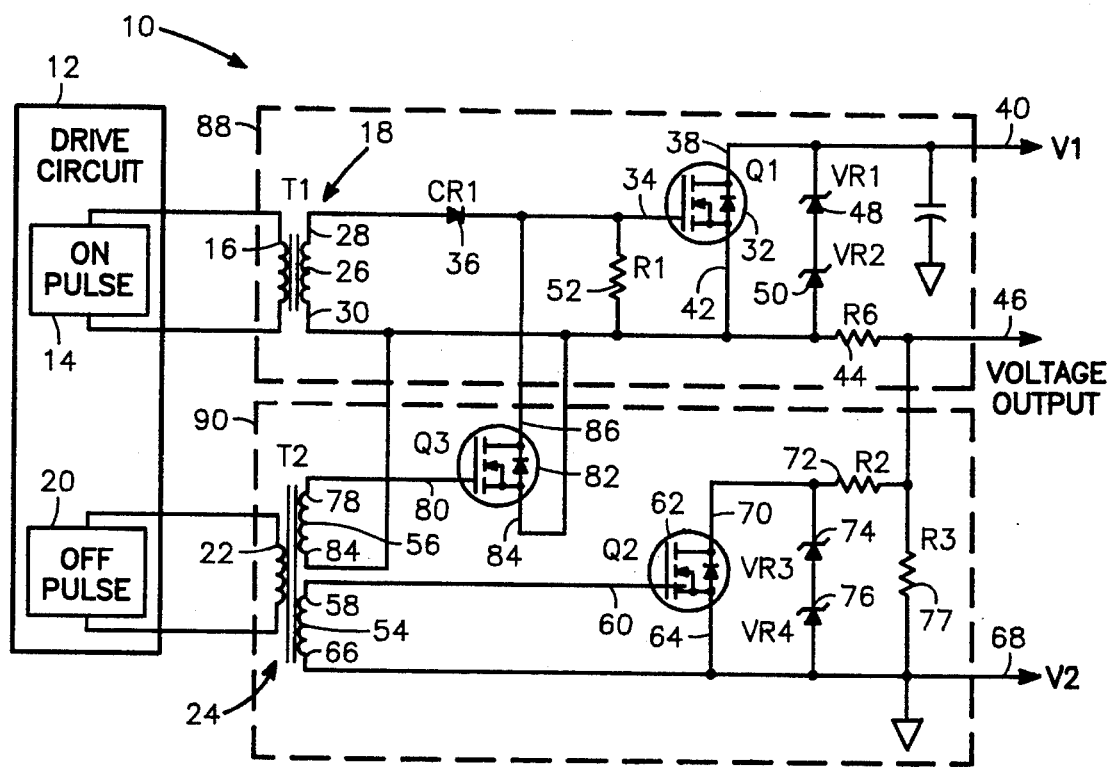
FIG. 1 is a schematic diagram of a fast, high voltage modulator circuit.

FIG. 1 shows an embodiment of a fast, high voltage modulator circuit 10. The circuit 10 receives input pulses from a drive circuit 12. The drive circuit or drive section 12 has an "on" pulse section 14 connected across a primary 16 of a first transformer 18. The drive circuit 12 also has an "off" pulse section 20 connected across a primary 22 of a second transformer 24.

A secondary 26 of the first transformer 18 has a positive side 28 and a negative side 30. The positive side 28 of the secondary 26 is connected to a gate 34 of a first MOSFET 32 through a forward biased diode 36. A drain 38 of the first MOSFET 32 is connected to a first input voltage 40. A source 42 of the first MOSFET 32 is connected to the negative side 30 of the secondary 26 of the first transformer 18 and an output resistor 44, which in turn is connected to an output 46. A pair of zener diodes 48, 50 are connected between the drain 38 and the source 42 of the first MOSFET 32. A bias resistor 52 is connected between the gate 34 and the source 42 of the first MOSFET 32. As disclosed herein, the MOSFET transistors are model IRFBG20 power MOSFETS made by International Rectifier of El Segundo, Calif.

The second transformer 24 has a first secondary 54 and a second secondary 56. A positive side 58 of the first secondary 54 is connected to a gate 60 of a second MOSFET 62. A source 64 of the second MOSFET 62 is connected to a negative side 66 of the first secondary 54 of the second transformer 24 and to a second input voltage 68. A drain 70 of the second MOSFET 62 is connected to the output 46 through a resistor 72. A pair of zener diodes 74, 76 are connected between the source 64 and the drain 70 of the second MOSFET 62. A resistor 77 is connected between the output 46 and the second input voltage 68.

The second secondary 56 of the second transformer 24 has a positive side 78 connected to a gate 80 of a third MOSFET 82. A negative side 84 of the second secondary 56 is connected to a source 84 of the third MOSFET 82 and to the negative side 30 of the secondary 26 of the first transformer 18. A drain 86 of the third MOSFET 82 is connected to the gate 34 of the first MOSFET 32.

The drive circuit 12 supplies very narrow input pulses to the transformers 18 and 24. If no pulses are supplied by the drive circuit 12 all the MOSFETS 32, 62, 82 are open or at high,impedance and the output 46 has a voltage of the second input voltage 68. When an on drive pulse, is applied to the primary 16 of the first transformer 18 the pulse is coupled to the gate 34 of the first MOSFET 32 by the diode 36. The drive pulse charges the gate 34 to source 42 capacitance through the diode. The diode prevents the gate 34 from discharging at the end of the drive pulse. As the gate 34 to source 42 is rapidly charged to 20 volts, the drain 38 to source 42 starts to conduct current. This FET transition to a low impedance state occurs very rapidly and will cause the output voltage 46 to rise to the first input voltage potential 40 in about 10 ns. The resistor 52 will discharge the gate 34 to source 42 after about 50 microsec. As long as periodic drive pulses are applied at an interval of 5 microsec or less, the MOSFET 32 will maintain a low impedance from drain to source to keep the output voltage 46 at the first input voltage potential 40. This describes what can be called an on-section 88, shown in dashed lines, of the high speed modulator circuit 10. The pair of zener diodes 48, 50 provide protection for the first MOSFET 32 from damaging voltage levels. Zeners 74 and 76 protect the second MOSFET 62.

While the modulator circuit 10 will turn off if no on drive pulses are input, an off-section 90 is provided to quickly turn off the first MOSFET =and switch in the second input voltage 68. When an off drive pulse is applied to the second transformer 24 the positive side 58 of the first secondary 54 applies a pulse to the gate 60 to source 64 of the second MOSFET 62 creating a low impedance path between the drain 70 and the source 64.

At the same time, when an off pulse is applied, the positive side 78 of the second secondary 56 applies a positive pulse to the gate 80 of the third MOSFET 82. This causes the drain 86 to source 84 to become a low impedance from a typical value of 200 kilo-ohms. As a result any residual bias between the gate 34 and the source 42 of the first MOSFET 32 is dissipated. The first MOSFET 32 opens, i.e., becomes a high impedane cutting off the first input voltage 40 from the output 46. As a result, the second input voltage 68 is connected to the resistor 72. In the preferred embodiment, the resistor 72 has a very low value, five ohms, while the resistor 77 has a large value, one megohm. As a result, the output 46 is quickly switched to the second input voltage 68.

A key to the fast switching capability of the modulator circuit 10 is the low inductance of the first transformer 18 and the second transformer 24. Typically these are single winding transformers having values of one micro-Henry. This is made possible by the fact that the input pulses are very narrow, ranging from 25–50 nanoseconds.

Figure 2:
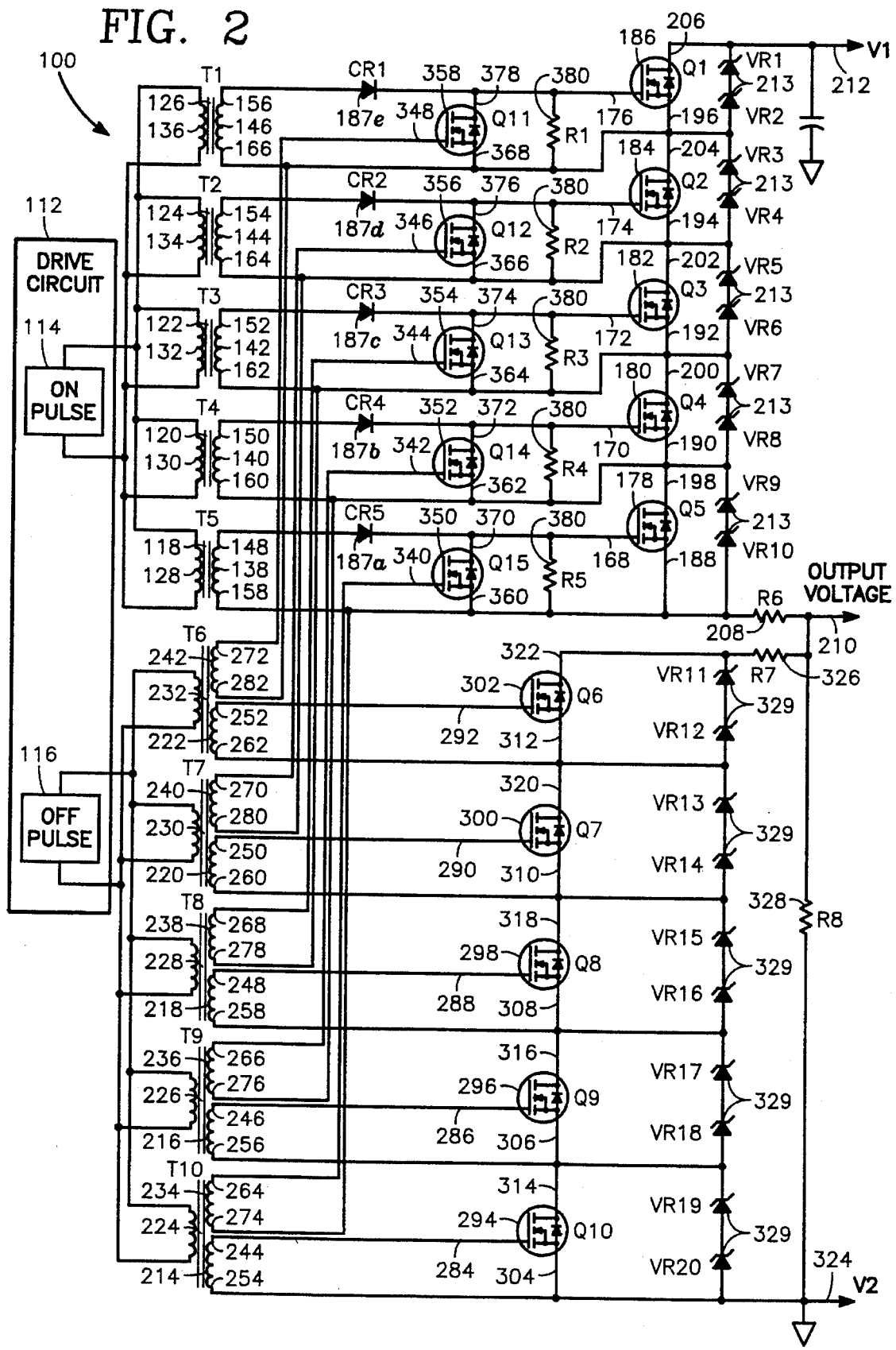
FIG. 2 is a schematic diagram of a stacked, fast, high voltage modulator circuit.

The MOSFETS are contemplated to be high voltage MOSFETS having break down voltages of about 1000 volts. In order to switch higher voltages, the on-section 88 is stacked with a plurality of other on sections, and the off-section 90 is also stacked. An example, showing five sections stacked together is shown in FIG. 2. The number of sections can be increased to achieve higher voltages, with the only limitation being stray capacitance. It is also advantageous to have a drive circuit for each of the transformers to increase switching speed. A stacked fast, high voltage modulator circuit 100 is shown in FIG. 2. The modulator circuit 100 has a drive section 112 having a on pulse section 114 and a off pulse section 116. The on-pulse section 114 is connected to a plurality of first transformers 118–126, each having a primary 128–136 and a secondary 138–146. The secondaries 138–146 each have a positive side 148–156 and a negative side 158–166.

The positive side 148–156 of the secondaries 138–146 of the plurality of first transformers 118–126 are connected to gates 168–176 of a plurality of first MOSFETS 178–186 respectively through forward biased diodes 187a–187e. The plurality of first MOSFETS 178–186 also include sources 188–196 and drains 198–206. The drain 198 of a first 178 of the plurality of first MOSFETS 178–186 is connected to the source 190 of a second 180 of the plurality of first MOSFETS 178–186. The drain 200 of the second 180 of the plurality of first MOSFETS 178–186 is connected to the source 192 of the third 182 of the plurality of first MOSFETS 178–186. This pattern repeating until all of the plurality of first MOSFETS 178–186 are connected. The source 188 of the first 178 of the plurality of first MOSFETS 178–186 is connected to an output resistor 208, which in turn is connected to an output 210. The drain 206 of a last 186 of the plurality of first MOSFETS 178–186 is connected to a first input voltage 212. The sources 188–196 of the plurality of first MOSFETS 178–186 are connected to the negative sides 158–166 respectively of the secondaries 138–146 of the plurality of first transformers 118–126. A plurality of zener diodes 213 are connected between the source 188 of the first 178 of the plurality of first MOSFETS 178–186 and the drain 206 of the last 186 of the plurality of first MOSFETS 178–186.

The "off" pulse section 116 is connected to a plurality of second transformers 224–232 each having a first secondary 214–222 and second secondary 234–242 respectively. The first secondaries 214–222 each have a positive side 244–252 and a negative side 254–262. The second secondaries 234–242 each have a positive side 264–272 and a negative side 274–282.

The positive sides 244–252 of the first secondaries 214–222 of the second transformers 224–232 are respectively connected to gates 284–292 of a plurality of second MOSFETS 294–302. The plurality of second MOSFETS 294–302 have sources 304–312 and drains 314–322. The drain 314 of the first 294 of the plurality of second MOSFETS 294–302 is connected to the source 306 of the second 296 of the plurality of second MOSFETS 294–302. This drain to source connection pattern is repeated until all of the plurality of second MOSFETS 294–302 are connected. The source 304 of the first 294 of the plurality of second MOSFETS 294–302 is connected to a second input voltage 324. The drain 322 of the last 302 of the plurality of second MOSFETS 294–302 is connected to the output 210 through a resistor 326. A resistor 328 connects the second input voltage 324 to the output 210. The sources 304–312 are respectively connected to the negative sides 254–262 of the first secondaries 214–222 of the plurality of second transformers 224–232. A plurality of zener diodes 329 are connected between the drain 322 of the last 302 of the plurality of second MOSFETS 294–302 and the source 304 of the first 294 of the plurality of second MOSFETS 294–302.

The positive sides 264–272 of the second secondaries 234–242 of the plurality of second transformers 224–232 are connected to gates 340–348 respectively of a plurality of third MOSFETS 350–358. The plurality of third MOSFETS 350–358 also have sources 360–368 and drains 370–378. Each of the plurality of third MOSFETS 350–358 have a resistor 380 connected between the source 360–368 and the drain 370–378. The sources 360–368 of each of the plurality of third MOSFETS 350–358 are respectively connected to the sources 188–196 of the plurality of first MOSFETS 178–186 and the negative sides 274–282 of the second secondaries 234–242 of the plurality of second transformers 224–232. The drain 370–378 of each of the plurality of third MOSFETS 350–358 are connected to the gate 168–176 respectively of the plurality of first MOSFETS 178–186.

The operation of the circuit 100, of FIG. 2, is very similar to circuit 10 of FIG. 1. The drive section 112 supplies on signals and off signals to the circuit 100. An on pulse 114 is applied to the plurality of first transformers 118–126. Which transmits the pulse to the gate 168–176 of each of the plurality of first MOSFETS 178–186, through a plurality of forward biased diodes 187. This closes each of the plurality of first MOSFETS 178–186, connecting the first input voltage 212 to the output resistor 208 and from there to the output 210.

Figure 3:
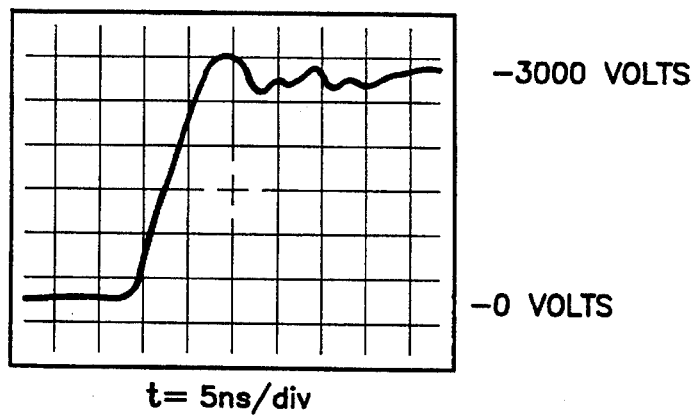
FIGS. 3 and 4 are oscilloscope traces of the output rise and fall times for the modulator shown in FIG. 2.
Figure 4:
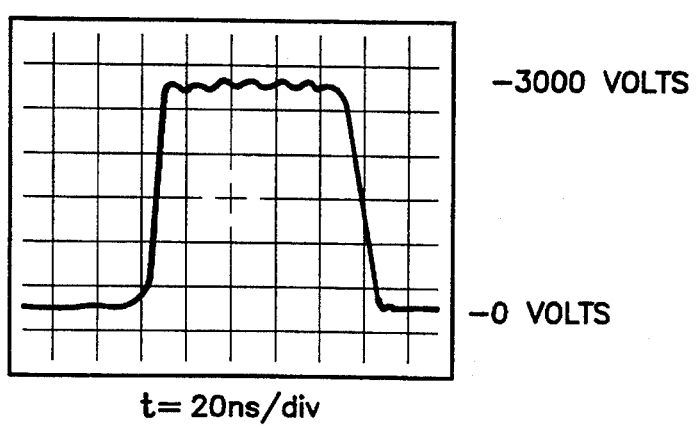

An off pulse 116 is applied to the plurality of second transformers 224–232. The first secondaries 214–222 of the plurality of second transformers 214–232 transmitting the off pulse to the gate 284–292 of the plurality of second MOSFETS 294–302. Thus closing the plurality of second MOSFETS 294–302 and connecting the second input voltage 324 to the output 210 through the resistor 326 having a low value compared to the resistor 328. In the preferred embodiment, the second input voltage 324 is lower than the first input voltage 212. The off pulse 116 is applied to the second secondaries 234–242, which transmit the pulse to the gate 340–348 of the plurality of third MOSFETS 350–358, thus, shorting out the gate 168–176 bias of the plurality of first MOSFETS 178–186 and opening the plurality of first MOSFETS 178–186. As a result, the first input voltage 212 is no longer connected to the output resistor 208. With the circuit 100, of FIG. 2, 3500 volt output pulses with rise and fall times of fifteen nanoseconds or less have been generated. FIG. 3 is a scope trace showing the rise time of a 3000 volt output pulse at five ns/div. as produced by the circuit of the present invention. FIG. 4 is a scope trace showing the rise and fall times of a 3000 volt output pulse at 20 ns/div. as produced by the circuit of the present invention.

Thus, there has been described a high speed, high voltage modulator circuit. The circuit being composed of stackable on-sections and off-sections to achieve switching of higher voltages. This stacking only being limited by stray capacitance.

What is claimed is:

1. A fast, high voltage modulator circuit, comprising:
   a first transformer having a secondary;
   a first MOSFET, having a gate, a drain and a source,
   a diode having a cathode and an anode,
   said gate being connected to the cathode of said diode, the anode of which is connected to a positive side of the secondary of said first transformer,
   the source connected to a negative side of the secondary of the first transformer and connected to an output,
   the drain connected to a first input voltage;
   a second transformer having a first secondary and a second secondary;
   a second MOSFET, having a gate, a source and a drain, the gate connected to a positive side of the first secondary of the second transformer,
   the source of said second MOSFET being connected to a negative side of the first secondary of the second transformer and connected to a second input voltage, the second input voltage being more negative than the first input voltage,
   the drain of said second MOSFET being connected to the output; and
   a third MOSFET, having a gate, a source and a drain;
   the gate of said third MOSFET being connected to a positive side of the second secondary of the second transformer,
   the source of said third MOSFET being connected to both a negative side of the second secondary of the second transformer and the negative side of the secondary of the first transformer,
   the drain of said third MOSFET being connected to the gate of the first MOSFET.

2. The fast, high voltage modulator circuit of claim 1, further including a drive circuit supplying periodic on pulses to the first transformer and periodic off pulses to the second transformer.

3. The fast, high voltage modulator circuit of claim 1, further including a resistor connected at a first end to the gate of the first MOSFET and the drain of the third MOSFET, and a second end connected between the source of the first MOSFET and the source of the third MOSFET.

4. The fast, high voltage modulator circuit of claim 3, further including a second resistor connected between the source of the first MOSFET and the output.

5. The fast, high voltage modulator circuit of claim 4, further wherein a third resistor is connected between the drain of the second MOSFET and the output.

6. The fast, high voltage modulator circuit of claim 5, further including a fourth resistor connected between the source of the first MOSFET and the output.

7. A high voltage modulator circuit as in claim 1, comprising:
   a drive section for supplying an on signal and an off signal;
   and wherein said first transformer, first MOSFET, and diode comprise an on-section controlled by the on signal from the drive section for connecting the first input voltage to the output; and
   wherein said second transformer, second and third MOSFETs comprise an off-section controlled by the off signal from the drive section for turning off the on-section and connecting the second input voltage to the output.

8. A fast, high voltage modulator circuit that is stackable to accommodate higher voltages, comprising:
   a plurality of first transformers each having a primary and a secondary;
   a plurality of first MOSFETS each having a gate, a drain, and a source, wherein the drain of a first MOSFET of the plurality of first MOSFETS is connected to the source of a second MOSFET of the plurality of first MOSFETS and repeating this pattern until all of the plurality of first MOSFETS are connected, the drain of a last MOSFET of the plurality of first MOSFETS being connected to a first input voltage, the source of the first MOSFET of the plurality of first MOSFETS is connected to an output, the gates of the plurality of first MOSFETS each being connected to a positive side of a respective secondary of the secondaries of said plurality of first transformers;
   a plurality of second transformers each having a primary, a first secondary and a second secondary;
   a plurality of second MOSFETS each having a gate, a drain, and a source, wherein the drain of a first MOSFET of the plurality of second MOSFETS is connected to the source of a second MOSFET of the plurality of second MOSFETS and repeating this pattern until all Of the plurality of second MOSFETS are connected, the drain of a last MOSFET of the plurality of second MOSFETS being connected to the output, the source of the first MOSFET of the plurality of second MOSFETS is connected to a second input voltage, the second input voltage being lower than the first input voltage, the gates of the plurality of second MOSFETS each being connected to a positive respective side of the first secondaries of the plurality of second transformers; and
   a plurality of third MOSFETS each having a gate, a drain, and a source, wherein the drain of a first MOSFET of the plurality of third MOSFETS is connected to the gate of the first MOSFET of the plurality of first MOSFETS, the drain of a second MOSFET of the plurality of third MOSFETS is connected to the gate of the second MOSFET of the plurality of first MOSFETS, and repeating this pattern until the drain of a last MOSFET of the plurality of third MOSFETS is connected to the gate of the last MOSFET of the plurality of first MOSFETS, the source of the first MOSFET of the plurality of third MOSFETS is connected to the source of the first MOSFET of the plurality of first MOSFETS and to a negative side of the respective second secondary of one of the plurality of second transformers and repeating this pattern until the source of the last MOSFET of the plurality of third MOSFETS is connected to the source of the last MOSFET of the plurality of first MOSFETS, and the gates of the plurality of third MOSFETS are each connected to a positive side of the respective second secondary of one of the plurality of second transformers.

9. The fast, high voltage modulator circuit of claim 8, further including a plurality of first zener diodes connected between the drain of the last MOSFET of the plurality of first MOSFETS and the source of the first MOSFET of the plurality of first MOSFETS and further including a plurality of second zener diodes between the drain of the last MOSFET of the plurality of second MOSFETS and the source of the first MOSFET of the plurality of second MOSFETS.

10. The fast, high voltage modulator circuit of claim 8, further including a drive circuit connected to a plurality of said primaries of the plurality of first transformers and a plurality of said primaries of the plurality of second transformers.

11. The fast,high voltage modulator circuit claim 8, further including a plurality of drive circuits connected to the plurality of said primaries, wherein one drive circuit of a plurality of drive circuits is connected to each said primary of the plurality of first transformers and another drive circuit of the plurality of drive circuits is connected to each said primary of the plurality of second transformers.

12. The fast, high voltage modulator circuit of claim 10, wherein the drive circuit provides on pulses to the plurality of said primaries of the plurality of first transformers and off pulses to the plurality of said primaries of the plurality of second transformers.

13. The fast, high voltage modulator circuit claim 11, wherein the plurality of drive circuits provide on pulses simultaneously to the plurality of said primaries of the plurality of first transformers and off pulses simultaneously to the plurality of said primaries of the plurality of second transformers.

\* \* \* \* \*